US012787204B2

(12) United States Patent
Huang et al.

(10) Patent No.: US 12,787,204 B2
(45) Date of Patent: Nov. 3, 2026

(54) SERVER AND EXPANSION MODULE

(71) Applicant: Wiwynn Corporation, New Taipei City (TW)

(72) Inventors: Po Han Huang, New Taipei City (TW); Hung Chien Wu, New Taipei City (TW); Chih Hui Hsieh, New Taipei City (TW)

(73) Assignee: WIWYNN CORPORATION, New Taipei City (TW)

( * ) Notice: Subject to any disclaimer, the term of this patent is extended or adjusted under 35 U.S.C. 154(b) by 106 days.

(21) Appl. No.: 18/791,580

(22) Filed: Aug. 1, 2024

(65) Prior Publication Data

US 2025/0113456 A1 Apr. 3, 2025

(30) Foreign Application Priority Data

Sep. 28, 2023 (TW) ................................ 112137529

(51) Int. Cl.

| | |
|---|---|
| ***H05K 7/14*** | (2006.01) |
| ***H05K 5/02*** | (2006.01) |
| ***H05K 5/03*** | (2006.01) |
| ***H05K 7/20*** | (2006.01) |

(52) U.S. Cl.

CPC ......... *H05K 7/1485* (2013.01); *H05K 5/0295* (2013.01); *H05K 5/03* (2013.01); *H05K 7/20272* (2013.01)

(58) Field of Classification Search

None

See application file for complete search history.

(56) References Cited

U.S. PATENT DOCUMENTS

| | | | | |
|---|---|---|---|---|
| 5,831,821 | A * | 11/1998 | Scholder | H05K 7/1429 361/679.58 |
| 11,150,705 | B1 * | 10/2021 | Hsieh | H05K 7/1487 |
| 2022/0087063 | A1 * | 3/2022 | Shih | H05K 7/20263 |
| 2022/0159874 | A1 | 5/2022 | Chen et al. | |
| 2023/0062355 | A1 * | 3/2023 | Zhang | G06F 1/185 |
| 2024/0314967 | A1 * | 9/2024 | Hsieh | G06F 1/185 |
| 2024/0357763 | A1 * | 10/2024 | Carver | G06F 1/185 |

OTHER PUBLICATIONS

TW Office Action which was issued by the TIPO on Mar. 11, 2024 in application No. 112137529.

* cited by examiner

*Primary Examiner* — Allen L Parker
*Assistant Examiner* — Christopher L Augustin
(74) *Attorney, Agent, or Firm* — McClure, Qualey & Rodack, LLP

(57) ABSTRACT

A server includes a housing, a motherboard and at least one expansion module. The housing has an accommodation space and a front opening. The front opening is located at one side of the accommodation space and communicates with the accommodation space. The motherboard is located in the accommodation space and has at least one mainboard connector. The expansion module is removably disposed in the accommodation space and exposed to outside from the front opening. The expansion module includes a main body, a main connector and two fluid connectors. The main connector is disposed on the main body and removably assembled with the mainboard connector of the motherboard. The fluid connectors are disposed on the main body.

20 Claims, 12 Drawing Sheets

SERVER AND EXPANSION MODULE

CROSS-REFERENCE TO RELATED APPLICATIONS

This non-provisional application claims priority under 35 U.S.C. § 119(a) on Patent Application No(s). 112137529 filed in Taiwan, R.O.C. on Sep. 28, 2023, the entire contents of which are hereby incorporated by reference.

TECHNICAL FIELD

The disclosure relates to a server and an expansion module.

BACKGROUND

In general, a server is provided with expansion cards for expanding the performance of the server. Before performing maintenance on the expansion cards in the server, a user needs to turn off the server, move the server out of a server rack, remove an upper cover of a housing of the server, and then disconnect various cables or pipelines. By doing so, the expansion cards are allowed to be removed from the server. However, the aforementioned processes are time-consuming and troublesome, which reduces the efficiency of the maintenance of the expansion cards. Therefore, how to address the aforementioned issue is one of the topics in this field.

SUMMARY

The disclosure provides a server and an expansion module that enhance the efficiency of the maintenance of the expansion module.

One embodiment of the disclosure provides a server. The server includes a housing, a motherboard and at least one expansion module. The housing has an accommodation space and a front opening. The front opening is located at one side of the accommodation space and communicates with the accommodation space. The motherboard is located in the accommodation space and has at least one mainboard connector. The expansion module is removably disposed in the accommodation space and exposed to outside from the front opening. The expansion module includes a main body, a main connector and two fluid connectors. The main connector is disposed on the main body and removably assembled with the mainboard connector of the motherboard. The fluid connectors are disposed on the main body.

Another embodiment of the disclosure provides an expansion module. The expansion module includes a main body, a main connector and two fluid connectors. The main connector is disposed on the main body and configured to be removably assembled with a mainboard connector of a motherboard. The fluid connectors are disposed on the main body.

According to the server and the expansion module as discussed in the above embodiments, the expansion module is removably disposed in the accommodation space of the housing and exposed to outside from the front opening, and the main body of the expansion module is provided with the fluid connectors and the main connector removable from the mainboard connector of the motherboard. Therefore, when the user desires to remove the expansion module from the housing for maintenance, the user can directly draw the expansion module out of the housing through the front opening without turning off the power of the server, drawing the server out of a server rack, removing an upper cover of the housing and detaching various pipelines or cables, thereby improving the efficiency of the maintenance of the expansion module.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
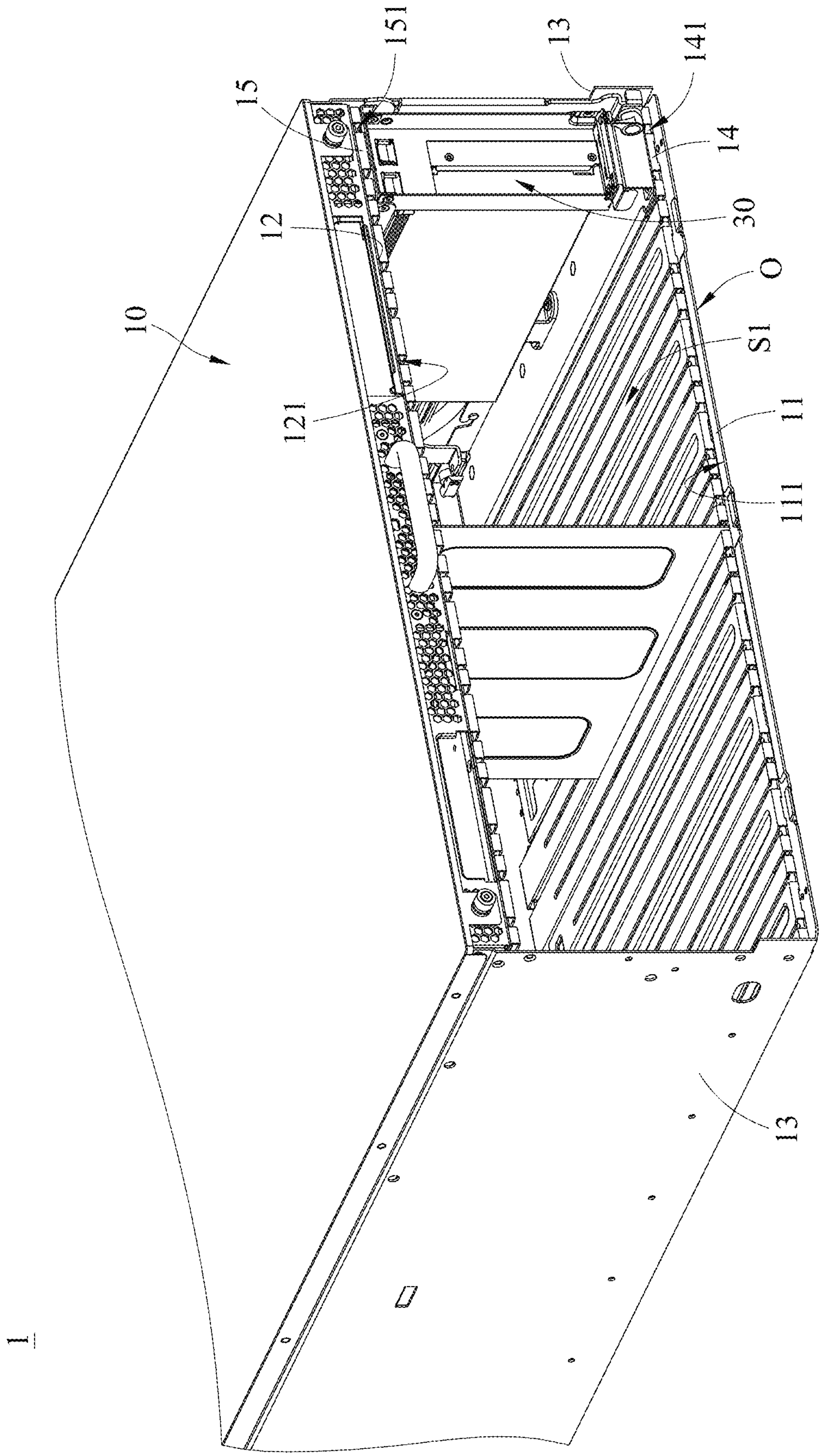
FIG. 1 is a partial perspective view of a server according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
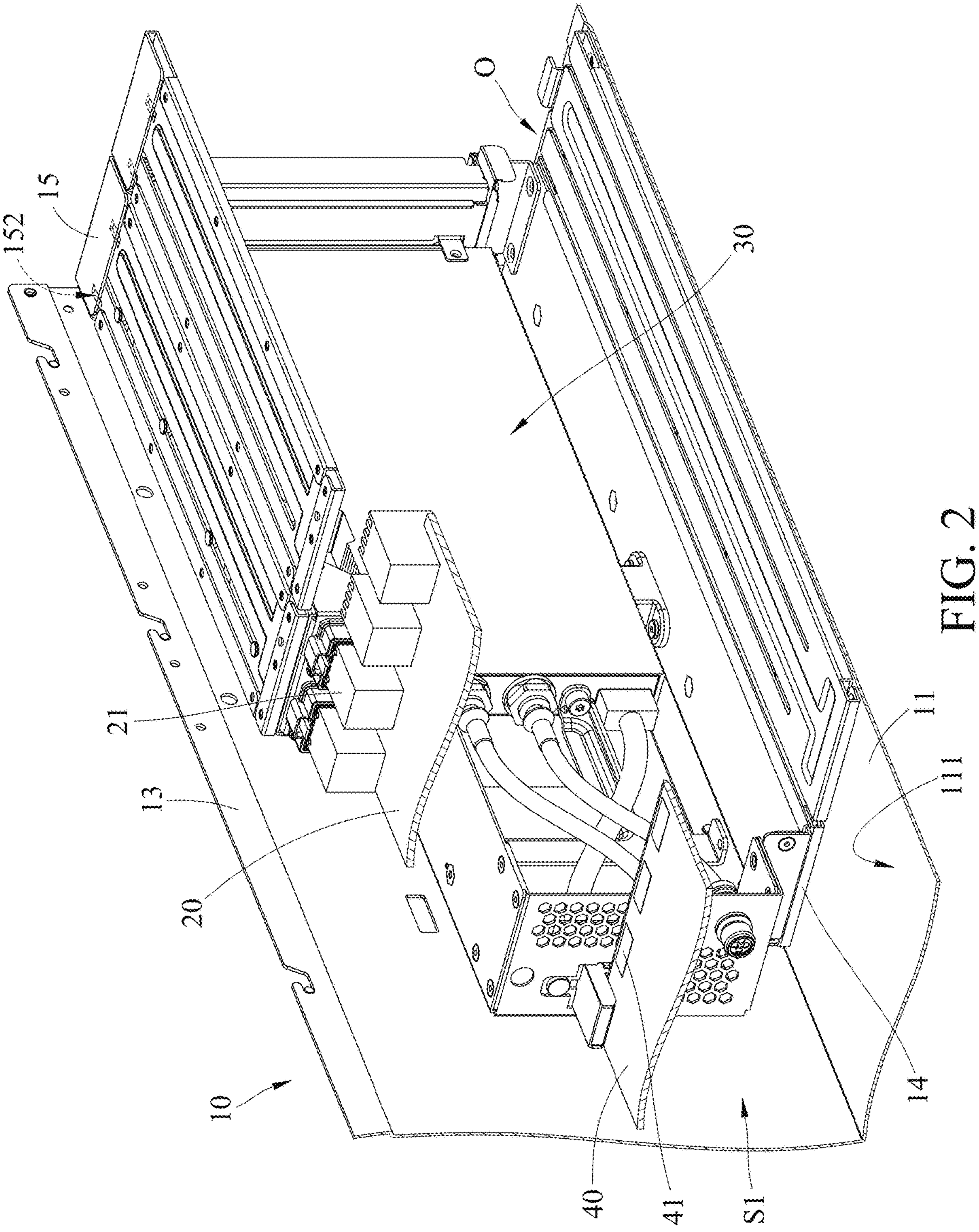
FIG. 2 is another partial perspective view of the server in FIG. 1.

Referring to FIGS. 1 and 2, FIG. 1 is a partial perspective view of a server 1 according to one embodiment of the disclosure, and FIG. 2 is another partial perspective view of the server 1 in FIG. 1.

In this embodiment, the server 1 includes a housing 10, a motherboard 20 and an expansion module 30. In addition, the server 1 may further include a power distribution board 40. In order to clearly show interconnections among the expansion module 30, the motherboard 20 and the power distribution board 40, there is only one expansion module 30 shown in the figures. However, there may be two or more expansion modules 30 in the server 1. In addition, in the following paragraphs, while the quantities of the component and the structure cooperated with the expansion module 30 are described as one, they are not limited as such in the disclosure. In practice, the quantities of the component and the structure may vary depending on the actual quantity of the expansion module 30.

The housing 10 includes a bottom plate 11, a top plate 12 and two side plates 13. The bottom plate 11 is connected to the top plate 12 via the two side plates 13, and the bottom plate 11, the side plates 13 and the top plate 12 together surround and form an accommodation space S1 and a front opening O, where the front opening O is located at one side of the accommodation space S1 and communicates with the accommodation space S1.

In this embodiment, the bottom plate 11 has a support surface 111 facing the accommodation space S1, and the top plate 12 has a support surface 121 facing the accommodation space S1. In addition, the housing 10 may further include a first guiding component 14 and a second guiding component 15. The first guiding component 14 and the second guiding component 15 are respectively fixed to the support surface 111 of the bottom plate 11 and the support surface 121 of the top plate 12 and extend from the front opening O inwards the accommodation space S1. The first guiding component 14 has a guide channel 141, and the second guiding component 15 has a guide channel 151 and an engagement hole 152.

The motherboard 20 is located in the accommodation space S1 of the housing 10 and has a mainboard connector 21, and the mainboard connector 21 is located at one side of the motherboard 20 located closer to the front opening O. The power distribution board 40 is located in the accommodation space S1 of the housing 10 and has an electrical connection portion 41, and the electrical connection portion 41 is located at one side of the power distribution board 40 located closer to the front opening O.

Figure 3:
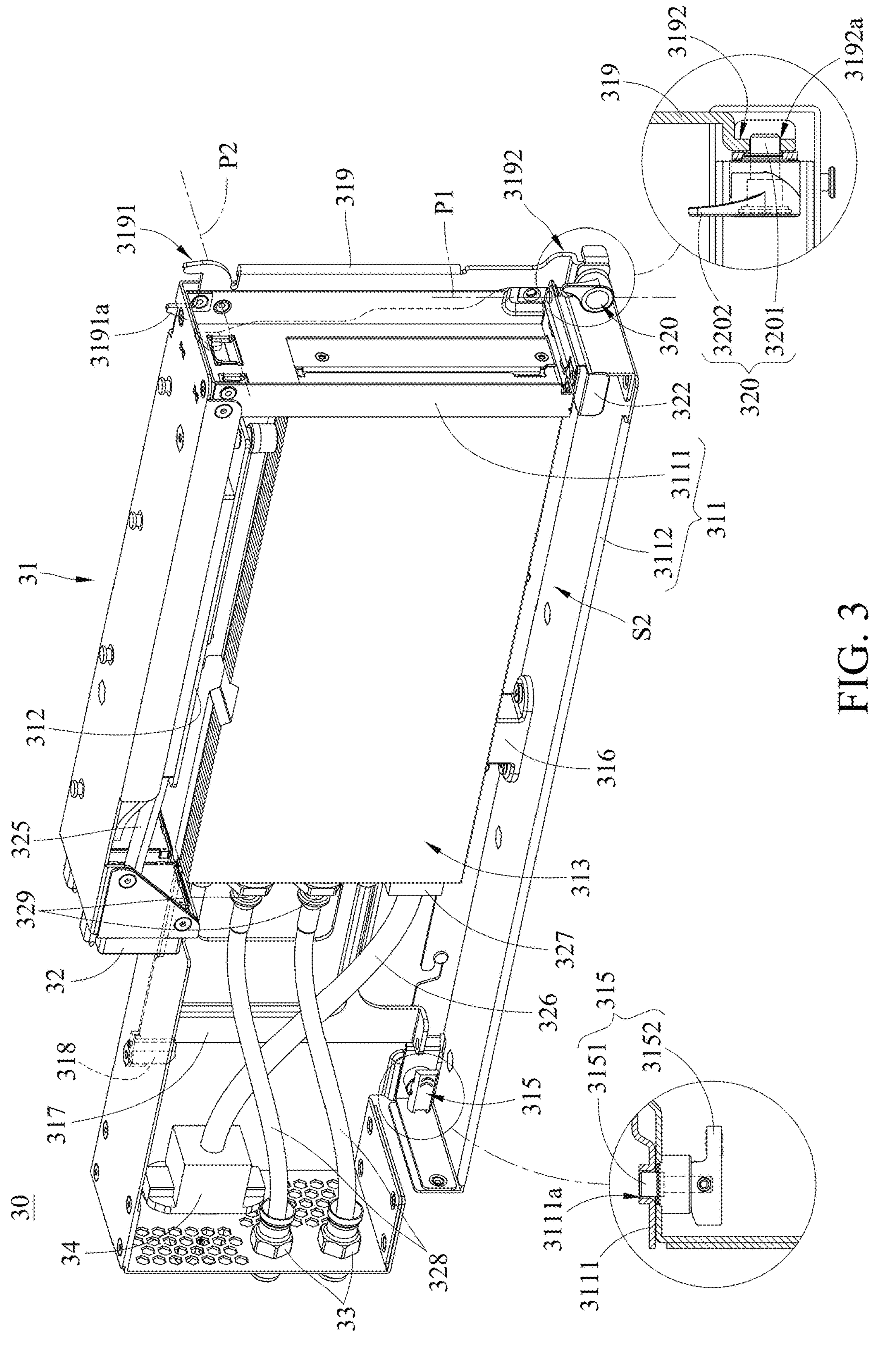
FIG. 3 is a perspective view of an expansion module in FIG. 1.
Figure 4:
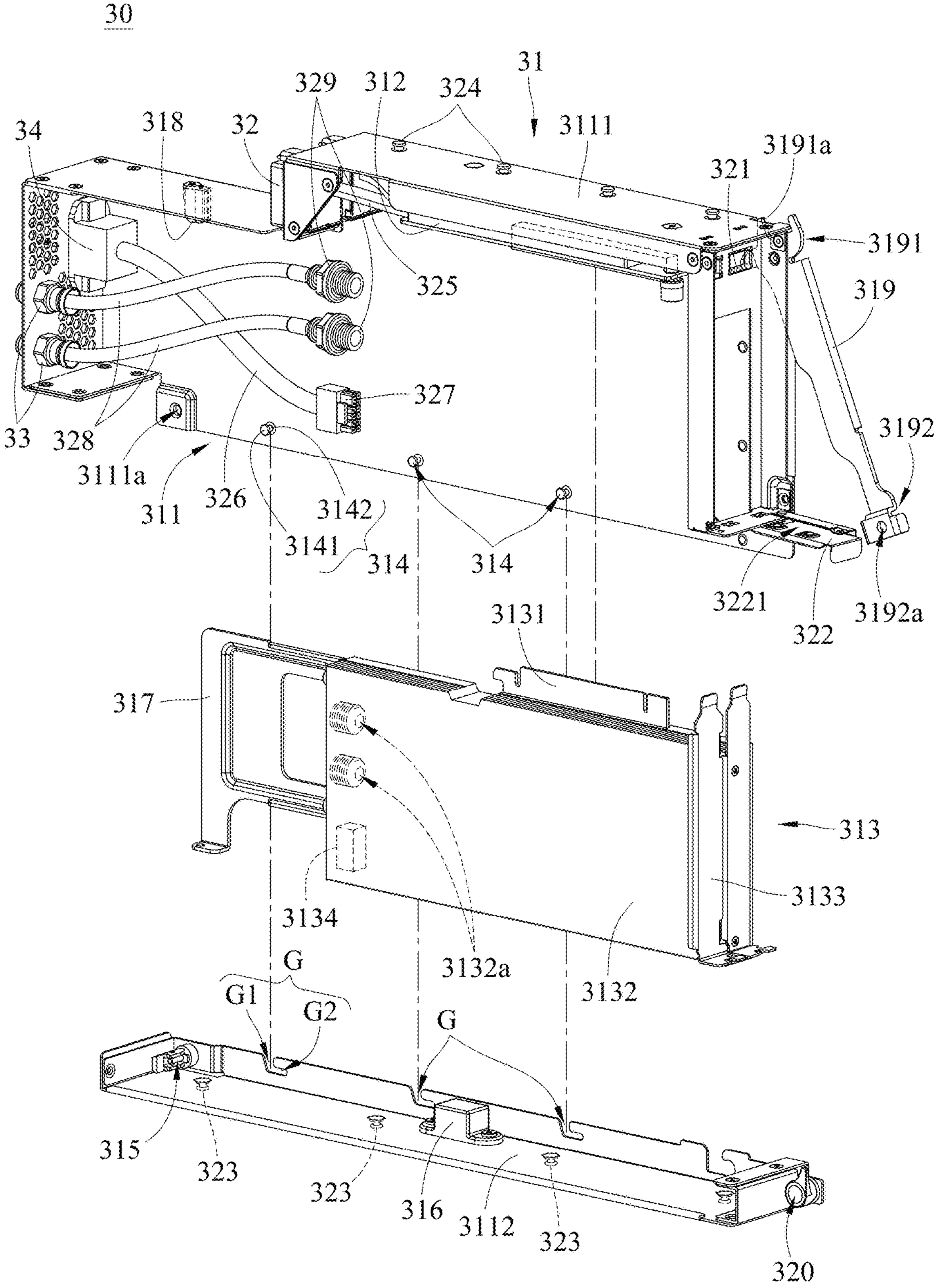
FIG. 4 is an exploded view of the expansion module in FIG. 3.

The expansion module 30 is removably disposed in the accommodation space S1 of the housing 10 and is located closer to the front opening O than the motherboard 20 and the power distribution board 40, and the expansion module 30 is exposed to outside from the front opening O. Specifically, referring to FIGS. 3 and 4, FIG. 3 is a perspective view of the expansion module 30 in FIG. 1, and FIG. 4 is an exploded view of the expansion module 30 in FIG. 3. The expansion module 30 includes a main body 31, a main connector 32 and two fluid connectors 33. In addition, the expansion module 30 may further include a power connector 34.

The main body 31 of the expansion module 30 includes a casing 311, a riser card 312 and an expansion card assembly 313. In addition, the main body 31 may further include a plurality of mount components 314, a first fastener 315, a support 316, an extension component 317, a holder 318, a latch 319, a second fastener 320, an elastic component 321, a positioning component 322 and a plurality of guide blocks 323 and 324.

The casing 311 includes a cover portion 3111 and a base portion 3112. The base portion 3112 is removably mounted on the cover portion 3111. Specifically, in this embodiment, the base portion 3112 has a plurality of guide slots G, and each of the guide slots G has a release portion G1 and an engagement portion G2 connected to each other. The mount components 314 have similar structures, thus the following descriptions merely introduce one of them. The mount component 314 includes a wide portion 3141 and a narrow portion 3142, and the wide portion 3141 is connected to the cover portion 3111 via the narrow portion 3142. A width of the wide portion 3141 is greater than a width of the narrow portion 3142 and a width of the engagement portion G2 of the guide slot G. The narrow portions 3142 of the mount components 314 are respectively located in the engagement portions G2 of the guide slots G of the base portions 3112, and the base portion 3112 is partially located between the wide portions 3141 of the mount components 314 and the cover portion 3111, such that the base portion 3112 is positioned on the cover portion 3111. The base portion 3112 can be moved for allowing the narrow portions 3142 of the mount components 314 to disengage from the guide slots G through the release portions G1 of the guide slots G of the base portion 3112, such that the base portion 3112 can be removed from the cover portion 3111.

The first fastener 315 is movably disposed on one side of the base portion 3112 and is selectively engaged with the cover portion 3111. For example, the cover portion 3111 has a positioning hole 3111*a*, and the first fastener 315 includes an insertion portion 3151 and a handle portion 3152 connected to each other, and the insertion portion 3151 is inserted into the positioning hole 3111*a* of the cover portion 3111 so as to fix the base portion 3112 to the cover portion 3111. The handle portion 3152 can be operated to move the insertion portion 3151 so as to force the insertion portion 3151 to detach from the positioning hole 3111*a* of the cover portion 3111, such that the base portion 3112 can be moved relative to the cover portion 3111.

In this embodiment, the cover portion 3111 and the base portion 3112 together form an inner space S2. The riser card 312 and the expansion card assembly 313, for example, support PCIe interface, such as PCIe 5.0. The riser card 312 and the expansion card assembly 313 are located in the inner space S2 of the casing 311, and the riser card 312 is located farther way from the base portion 3112 than the expansion card assembly 313. The expansion card assembly 313 is, for example, double-width expansion card assembly, and the expansion card assembly 313 includes a circuit board 3131, a heat dissipation device 3132, a bracket structure 3133 and a power joint 3134. The circuit board 3131 is inserted into the riser card 312. The heat dissipation device 3132 is, for example, a structure provided with a fluid chamber (not shown) and has two mount holes 3132*a* communicating with the fluid chamber. The heat dissipation device 3132 is thermally coupled to the circuit board 3131 to absorb heat generated by electronic components (not shown) on the circuit board 3131. The bracket structure 3133 is, for example, an L-shaped plate and is fixed to one side of the heat dissipation device 3132. The power joint 3134 is electrically connected to the circuit board 3131 and located opposite to the bracket structure 3133.

The support 316 is fixed to the base portion 3112 of the casing 311 and supports the expansion card assembly 313. The extension component 317 is fixed to one side of the heat dissipation device 3132 of the expansion card assembly 313 located opposite to the bracket structure 3133. The holder 318 is fixed to the cover portion 3111 and the holder 318 is in contact with one side of the extension component 317 located farther away from the heat dissipation device 3132. In this embodiment, the support 316 and the holder 318 support and hold the expansion card assembly 313 at two adjacent sides of the expansion card assembly 313 so as to firmly position the expansion card assembly 313 and prevent the expansion card assembly 313 from being moved unwantedly relative to the riser card 312.

Note that the extension component 317 is an optional component; in some other embodiments, the extension component may be omitted, and the holder may be directly in contact with one side of the heat dissipation device located opposite to the bracket structure. Moreover, the holder 318 is also an optional component. In some other embodiments, the holder may be omitted, and the expansion card assembly may be in contact with a wall of the cover portion of the casing.

The latch 319 has a first end 3191 and a second end 3192 located opposite to each other, and the first end 3191 of the latch 319 has an engagement structure 3191*a*. The first end 3191 of the latch 319 is pivotably disposed on the cover portion 3111 of the casing 311, and the engagement structure 3191*a* is selectively engaged with the engagement hole 152 of the second guiding component 15 of the housing 10 (e.g., shown in FIG. 2).

The second fastener 320 is movably disposed on the base portion 3112 of the casing 311 and is located opposite to the first fastener 315. The second fastener 320 is selectively engaged with the second end 3192 of the latch 319. For example, the second end 3192 of the latch 319 has a insertion hole 3192*a*, and the second fastener 320 includes an insertion portion 3201 and a handle portion 3202, and the insertion portion 3201 is inserted into the insertion hole 3192*a* of the second end 3192 of the latch 319 so as to fix the latch 319 in a closed position. The handle portion 3202 can be operated to move the insertion portion 3201 so as to force the insertion portion 3201 to disengage from the insertion hole 3192*a* of the second end 3192 of the latch 319, such that the latch 319 can be rotated relative to the cover portion 3111.

The elastic component 321 is, for example, an extensive spring. Two opposite ends of the elastic component 321 are respectively connected to the cover portion 3111 of the casing 311 and the first end 3191 of the latch 319. For example, two opposite ends of the elastic component 321 are fixed to the cover portion 3111 and the first end 3191 of the latch 319 via hook structures. The elastic component 321 is configured to force the second end 3192 of the latch 319 to move away from the second fastener 320.

The positioning component 322 is pivotably disposed on the cover portion 3111 of the casing 311 and is abutted against the base portion 3112. A rotation axis P1 of the positioning component 322 is, for example, non-parallel to a rotation axis P2 of the latch 319. For example, the rotation axis P1 of the positioning component 322 is perpendicular to the rotation axis P2 of the latch 319. The positioning component 322 has a positioning groove 3221, and the bracket structure 3133 of the expansion card assembly 313 is partially located in the positioning groove 3221 of the positioning component 322.

Figure 5:
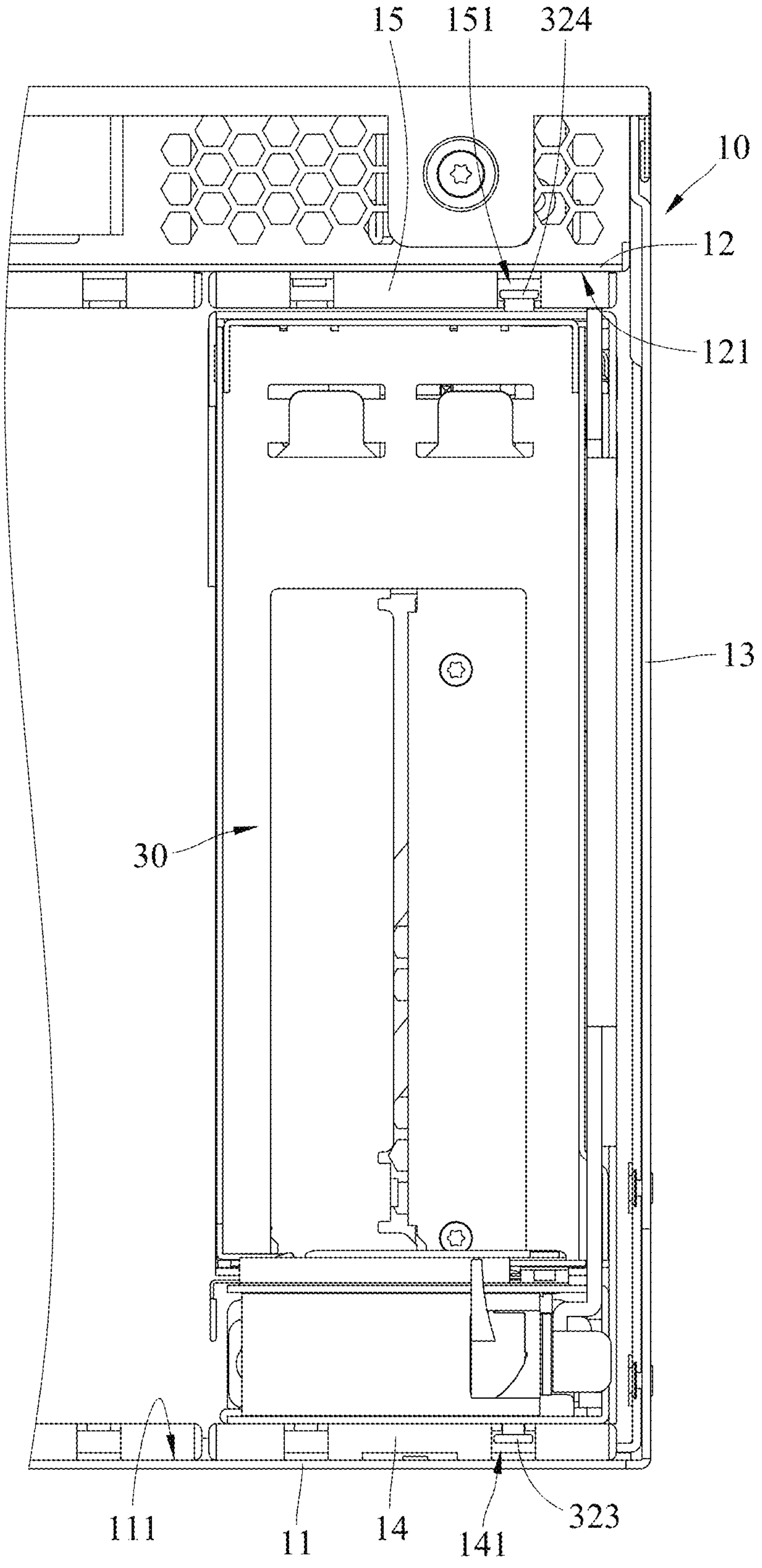
FIG. 5 is a front view of the server in FIG. 1.

Then, referring to FIGS. 4 and 5, FIG. 5 is a front view of the server 1 in FIG. 1. The guide blocks 323 and 324 are, for example, I-shaped rivets. The guide blocks 323 and 324 are fixed to two opposite sides of the casing 311 via a riveting manner and are located outside the inner space S2 of the casing 311. Specifically, the guide blocks 323 and 324 include a plurality of first guide blocks 323 and a plurality of second guide blocks 324. The first guide blocks 323 are fixed on a surface of the base portion 3112 facing away from the inner space S2 and are arranged along a straight line. The second guide blocks 324 are fixed on a surface of the cover portion 3111 facing away from the inner space S2 and are arranged along a straight line. The first guide blocks 323 and the second guide blocks 324 are slidably mounted into the guide channel 141 of the first guiding component 14 and the guide channel 151 of the second guiding component 15 of the housing 10, respectively, such that the casing 311 of the expansion module 30 is supported on the support surface 111 of the bottom plate 11 of the housing 10 via the first guiding component 14.

Note that the first guide blocks 323, the second guide blocks 324, the first guiding component 14 and the second guiding component 15 are optional components and may be used or omitted according to actual requirements.

Figure 6:
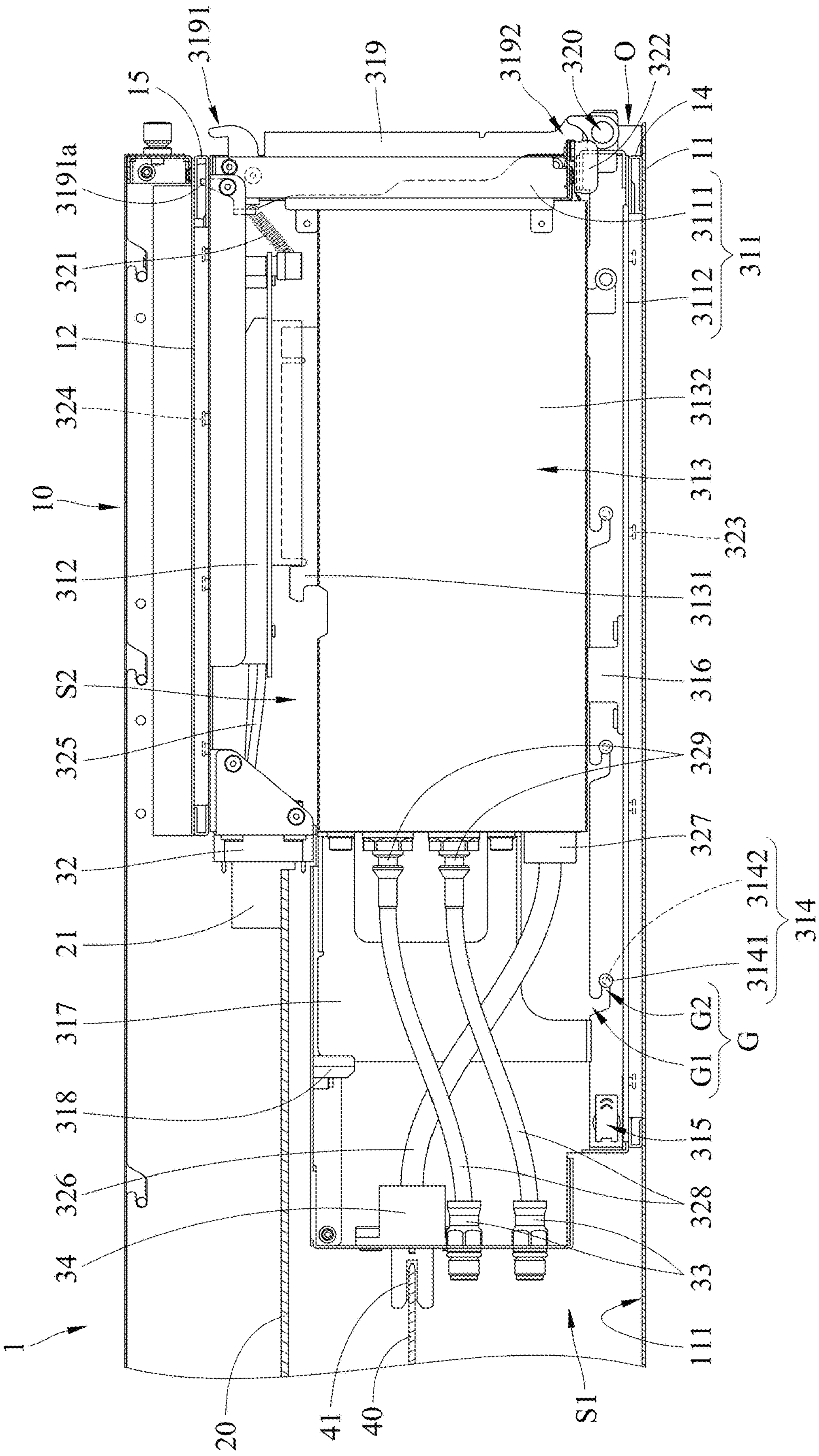
FIG. 6 is a partial cross-sectional view of the server in FIG. 1.

Then, referring to FIGS. 2, 4 and 6, FIG. 6 is a partial cross-sectional view of the server 1 in FIG. 1. The main connector 32, the two fluid connectors 33 and the power connector 34 are disposed at one side of the cover portion 3111 of the casing 311 located farther away the front opening O of the housing 10, and the main connector 32 is located closer to the front opening O than the power connector 34 and the two fluid connectors 33. The power connector 34 is located between the main connector 32 and the fluid connectors 33, and the fluid connectors 33 are located closer to the support surface 111 of the bottom plate 11 of the housing 10 than the power connector 34 and the main connector 32.

In this embodiment, the expansion module 30 may further include a main cable 325, a power cable 326, another power connector 327, two pipes 328 and other two fluid connectors 329.

The main connector 32 is electrically connected to the riser card 312 via, for example, the main cable 325, and the main connector 32 is removably assembled with the mainboard connector 21 of the motherboard 20, such that the circuit board 3131 of the expansion card assembly 313 is electrically connected to the mainboard connector 21 of the motherboard 20 via the riser card 312, the main cable 325 and the main connector 32. The motherboard 20 can transmit signals and power to the electronic components on the circuit board 3131 of the expansion card assembly 313 via the mainboard connector 21, the main connector 32, the main cable 325 and the riser card 312.

The power connector 34 is, for example, a busbar connector. The power connectors 34 and 327 are respectively connected to two opposite ends of the power cable 326. The power connector 327 is assembled with the power joint 3134 of the expansion card assembly 313, and the circuit board 3131 of the expansion card assembly 313 is electrically connected to the power connector 34 via the power joint 3134, the power connector 327 and the power cable 326. The power connector 34 is removably assembled with the electrical connection portion 41 of the power distribution board 40.

In this embodiment, the operation of the electronic components on the circuit board 3131 of the expansion card assembly 313 requires large power supply to operate, thus such large power is supplied to the server 1 via the power distribution board 40, the power connector 34, the power cable 326, the power connector 327 and the power joint 3134.

The fluid connectors 33 are connected to the fluid connectors 329 via the pipes 328. The fluid connector 329 are respectively assembled with the mount holes 3132*a* of the heat dissipation device 3132 of the expansion card assembly 313, such that the fluid chamber of the heat dissipation device 3132 is in fluid communication with the fluid connectors 33 via the fluid connectors 329 and the pipes 328. The fluid connectors 33 are respectively assembled with an inlet joint and an outlet joint of a manifold (not shown). Therefore, the expansion module 30 can be served a part of liquid cooling circulation, thus coolant delivered in the liquid cooling circulation can flow into and out of the heat dissipation device 3132 to take heat generated by the electronic components on the circuit board 3131 away.

In this embodiment, the fluid connectors 33 are located closer to the support surface 111 of the bottom plate 11 of the housing 10 than the power connector 34 and the main connector 32, which prevents liquid from falling on the power connector 34 or the main connector 32 when leakage occurs at the fluid connectors 33, thereby reducing the chance of short circuit or damage.

Note that the fluid connectors 33 are not limited to being located closer to the support surface 111 of the bottom plate 11 of the housing 10 than the power connector 34 and the main connector 32. The positions of the fluid connectors 33, the power connector 34 and the main connector 32 relative to the support surface 111 of the bottom plate 11 of the housing 10 may be modified according to actual requirements.

In this embodiment, the main connector 32 is located closer to the front opening O than the power connector 34 and the fluid connectors 33, which enables the motherboard 20 to have a portion extending towards the front opening O. Therefore, the motherboard 20 can have a larger area for the arrangement of circuits or electronic components.

Note that the main connector 32 is not limited to being located closer to the front opening O than the power connector 34 and the fluid connectors 33. The positions of the main connector 32, the power connector 34 and the fluid connectors 33 relative to the front opening O may be modified according to actual requirements.

On the other hand, the power connectors 34 and 327, the power cable 326, the fluid connectors 33 and 329 and the pipes 328 are optional components. In some other embodiments, when the electronic components on the circuit board of the expansion card assembly do not require large power supply during operation, the server may not include the power distribution board, the expansion module may not include the power connectors and the power cable, and the power required by the expansion card assembly may be provided via the motherboard and the riser card. In another embodiment, when the expansion module does not require to be cooled by liquid cooling manner, four of the fluid connectors and two of the pipes of the expansion module may be omitted.

Figure 7:
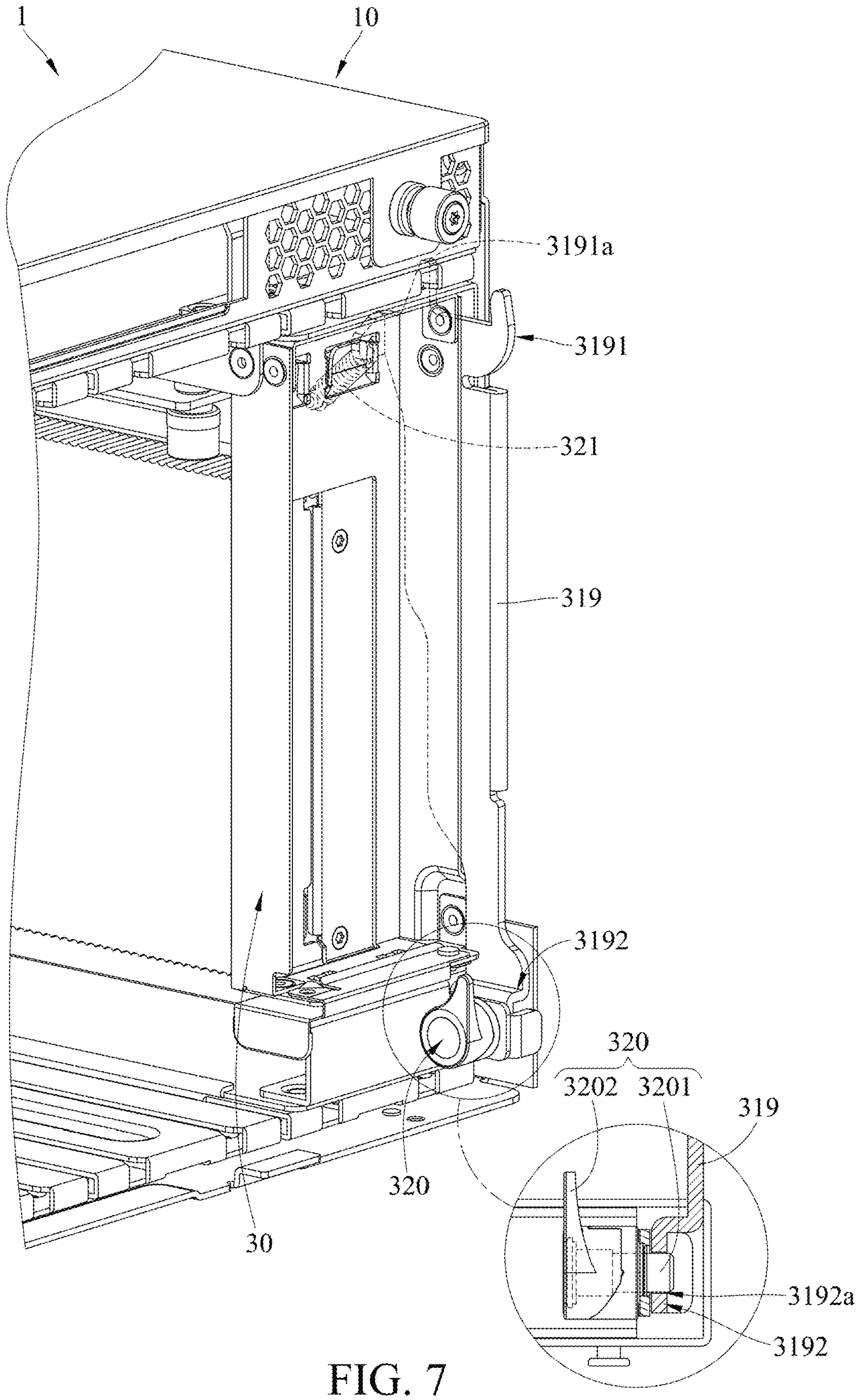
FIGS. 7 to 9 are schematic views showing the removal of the expansion module from a housing of the server.
Figure 8:
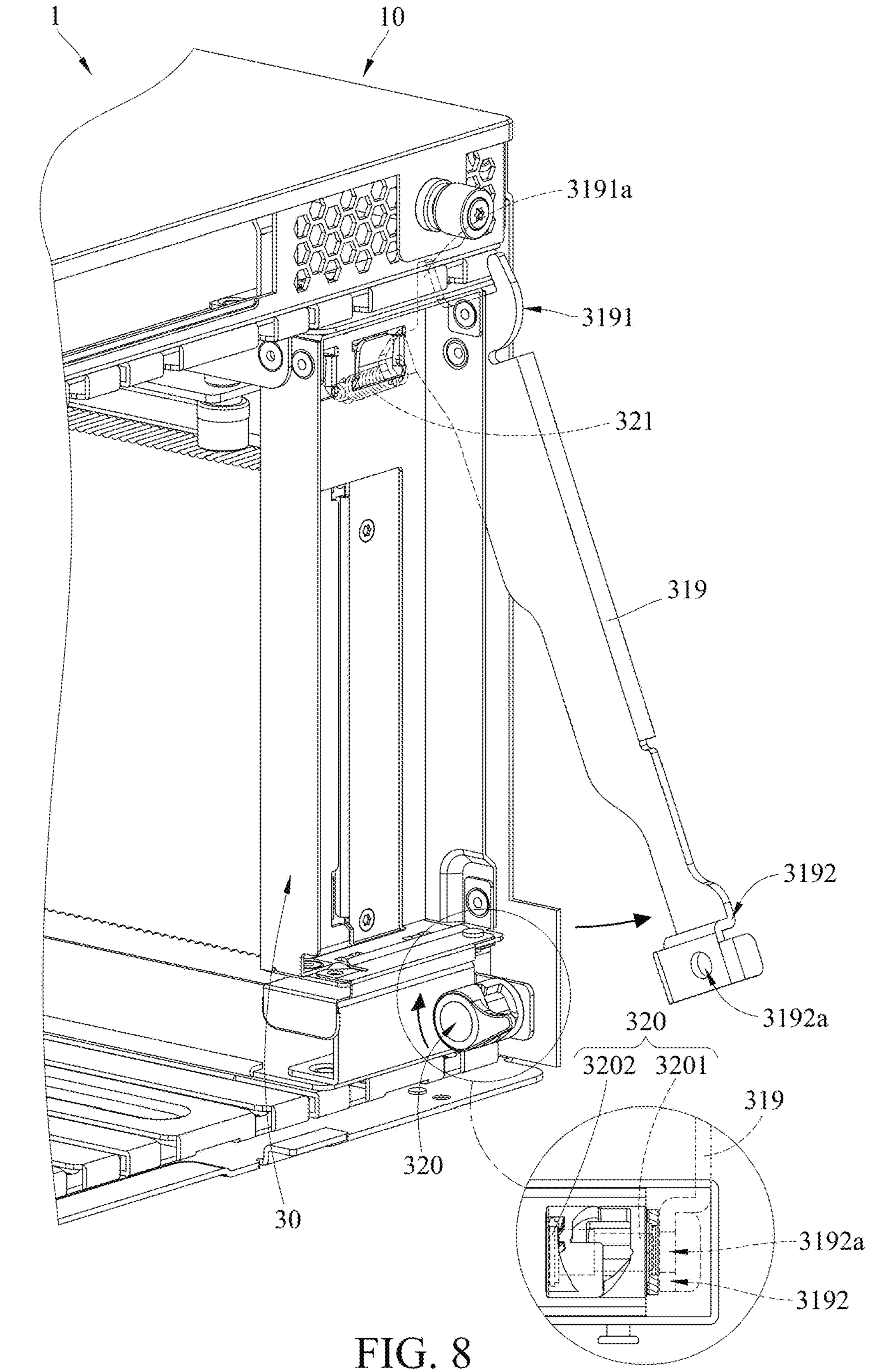
Figure 9:
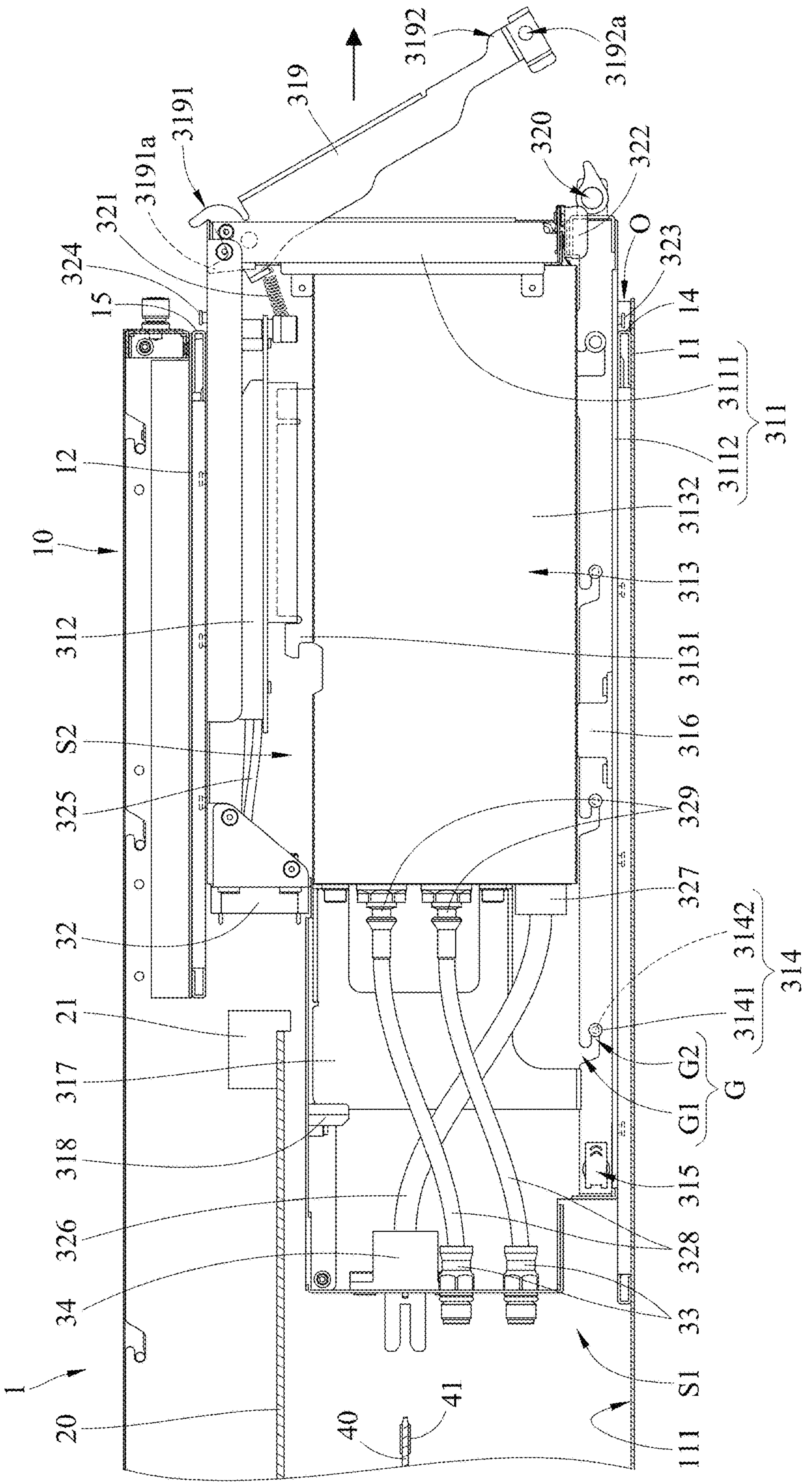

When a user wants to perform maintenance on the expansion module 30, the expansion module 30 is required to be removed from the housing 10 of the server 1. Specifically, referring to FIGS. 7 to 9, FIGS. 7 to 9 are schematic views showing the removal of the expansion module 30 from the housing 10 of the server 1.

The user operates the handle portion 3202 of the second fastener 320 in advance, such that the insertion portion 3201 of the second fastener 320 is disengaged from the insertion hole 3192*a* of the second end 3192 of the latch 319. As a result, the elastic component 321 is released to force the latch 319 to pivot an angle relative to the casing 311, such that the engagement structure 3191*a* of the first end 3191 of the latch 319 is disengaged from the engagement hole 152 of the second guiding component 15 of the housing 10 (e.g., shown in FIG. 2). At this moment, the user can hold the latch 319 to draw the entire expansion module 30 out of the housing 10 of the server 1, thus the main connector 32 is detached from the mainboard connector 21 of the motherboard 20, the power connector 34 is detached from the electrical connection portion 41 of the power distribution board 40, and the fluid connectors 33 are respectively detached from the outlet joint and the inlet joint of the manifold (not shown). Accordingly, overall maintenance on the expansion module 30 can then be performed.

In this embodiment, the expansion module 30 is removably disposed in the accommodation space S1 of the housing 10 and exposed to outside from the front opening O, and the main body 31 of the expansion module 30 is provided with the fluid connectors 33 and the main connector 32 removable from the mainboard connector 21 of the motherboard 20. Therefore, when the user desires to remove the expansion module 30 from the housing 10 for maintenance, the user can directly draw the expansion module 30 out of the housing 10 through the front opening O without turning off the power of the server 1, drawing the server 1 out of a server rack, removing an upper cover of the housing 10 and detaching various pipelines or cables, thereby enhancing the efficiency of the maintenance of the expansion module 30.

In addition, after the latch 319 is released from the second fastener 320, the elastic component 321 can automatically eject the latch 319, so as to facilitate the user to hold the latch 319 to draw the entire expansion module 30 out of the housing 10. Note that the elastic component 321 is an optional component and may be omitted when automatically ejecting the latch is not required.

Figure 10:
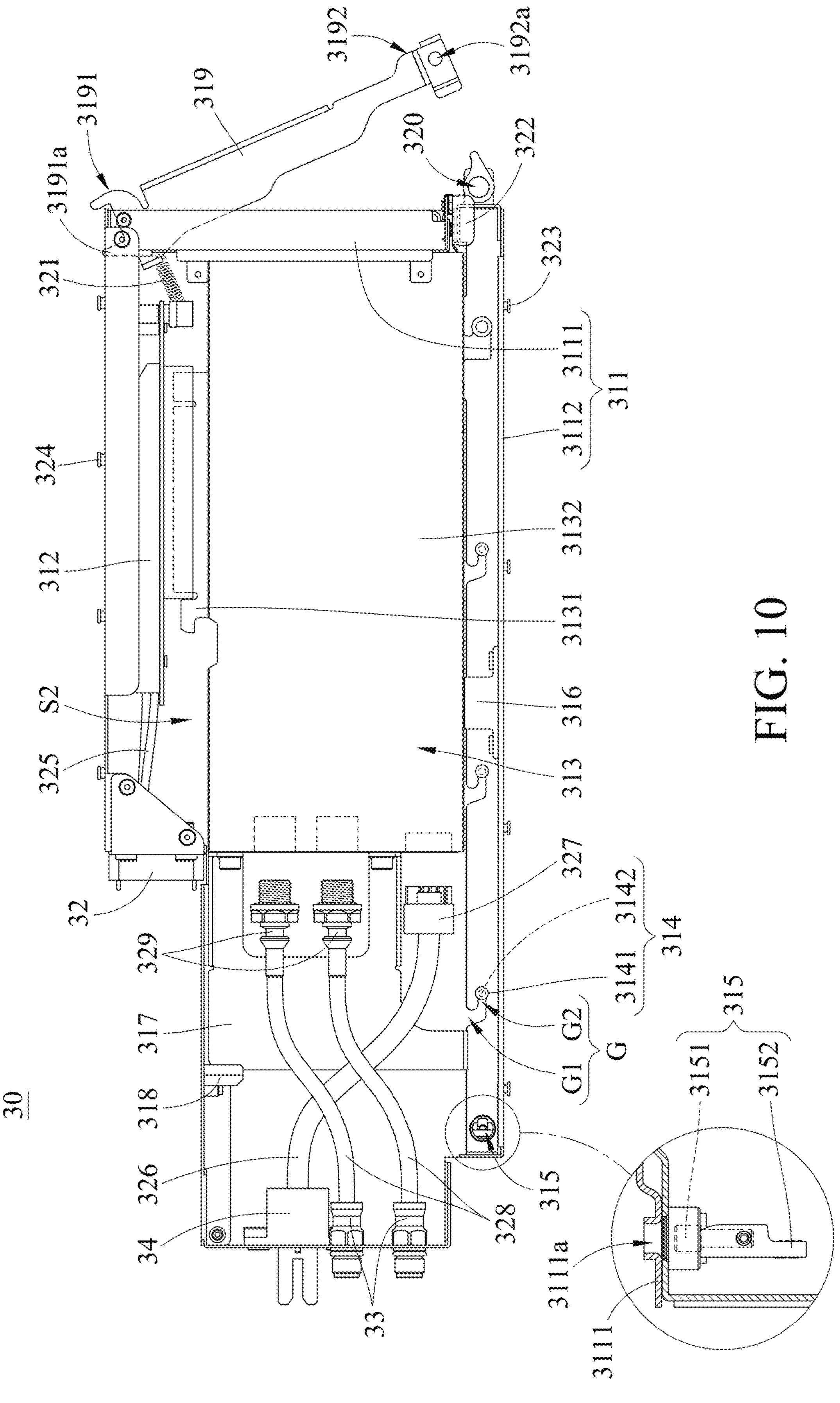
FIGS. 10 to 12 are schematic views showing the removal of an expansion card assembly from a casing.
Figure 11:
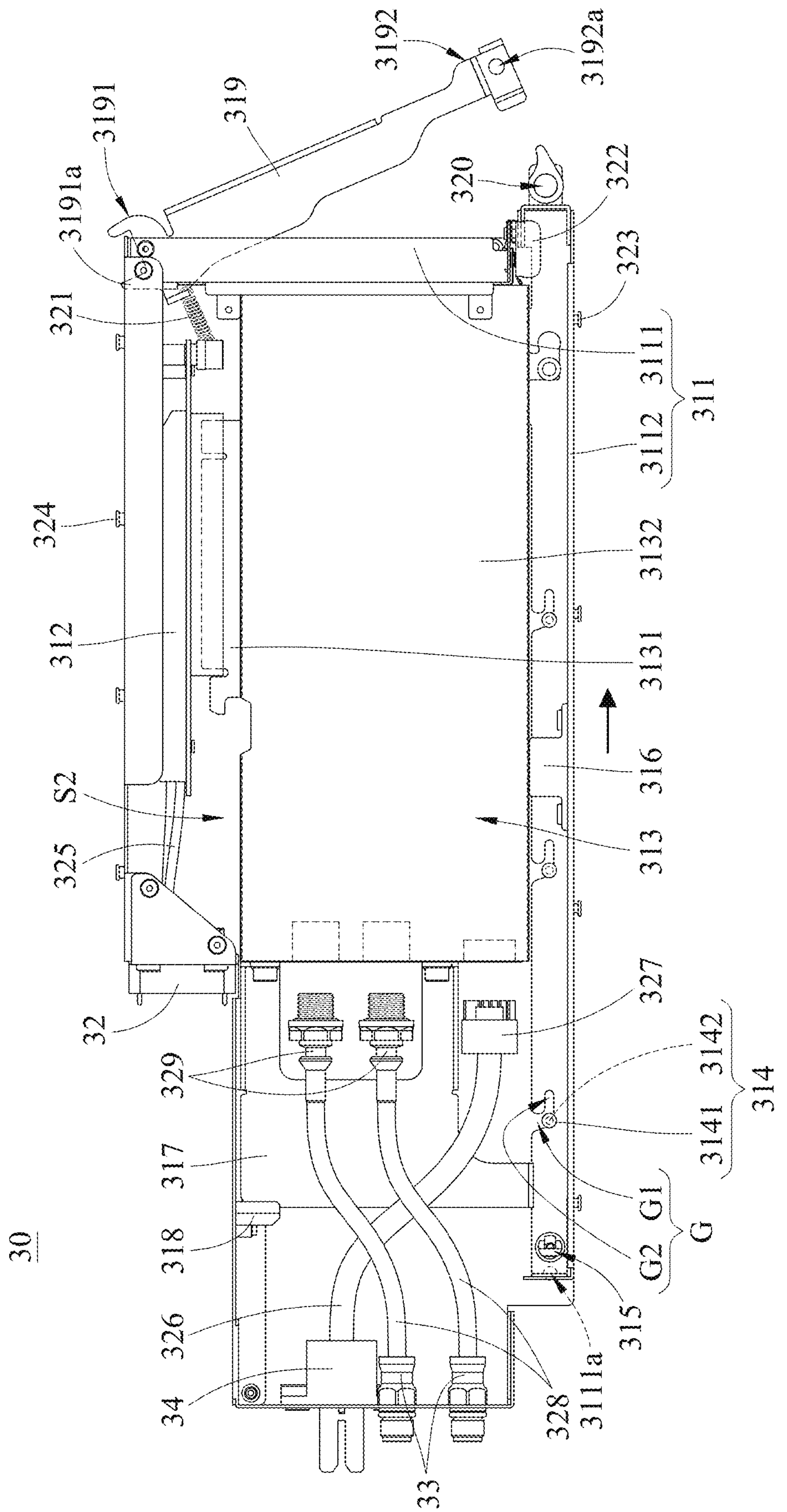
Figure 12:
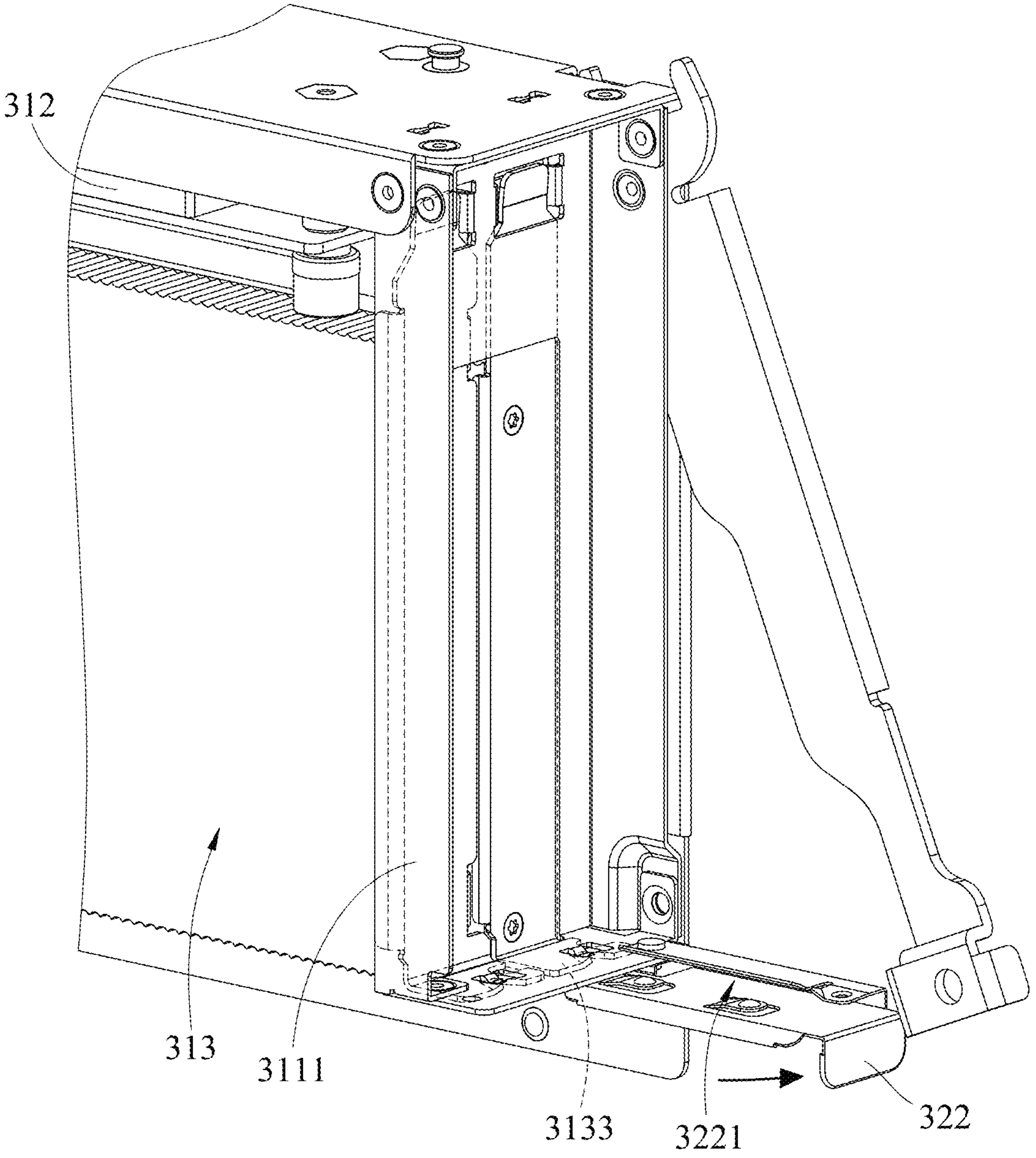

Then, referring to FIGS. 10 to 12, FIGS. 10 to 12 are schematic views showing the removal of the expansion card assembly 313 from the casing 311. When the expansion card assembly 313 is required to be removed from the casing 311 during the maintenance of the expansion module 30, the user is required to disconnect the power cable 326 and the pipes 328 from the expansion card assembly 313 in advance. Then, the user operates the handle portion 3152 of the first fastener 315 to detach the insertion portion 3151 of the first fastener 315 from the positioning hole 3111*a* of the cover portion 3111 of the casing 311. Then, the user slides the base portion 3112 of the casing 311 for moving the narrow portions 3142 of the mount components 314 from the engagement portions G2 to the release portions G1 of the guide slots G of the base portion 3112, such that the base portion 3112 can be removed from the cover portion 3111, thus the positioning component 322 is no longer positioned by the base portion 3112. Then, the user can rotate the positioning component 322 relative to the cover portion 3111 for detaching the positioning groove 3221 of the positioning component 322 from the bracket structure 3133 of the expansion card assembly 313. At this moment, the removal path of the expansion card assembly 313 from the riser card 312 is no longer limited, such that the expansion card assembly 313 can be removed from the riser card 312.

After the maintenance of the expansion module 30 is finished, the user can install the expansion card assembly 313 back to the riser card 312 and connect the power cable 326 and the pipes 328 with the expansion card assembly 313. Then, the user can rotate the positioning component 322 for positioning the bracket structure 3133 of the expansion card assembly 313. Then, the user can install the base portion 3112 of the casing 311 back to the cover portion 3111. At this moment, the user can install the entire expansion module 30 into the housing 10 while keeping the second fastener 320 not being inserted into the insertion hole 3192*a* of the second end 3192 of the latch 319, such that the main connector 32 of the expansion module 30 is assembled with the mainboard connector 21 of the motherboard 20, the power connector 34 of the expansion module 30 is assembled with the electrical connection portion 41 of the power distribution board 40, and the fluid connectors 33 are assembled with the outlet joint and the inlet joint of the manifold (not shown). Then, the user can pivot the latch 319 to move the second end 3192 of the latch 319 towards the second fastener 320 so as to engage the engagement structure 3191*a* of the first end 3191 of the latch 319 with the engagement hole 152 of the second guiding component 15 of the housing 10. Then, the user can operate the second fastener 320 to engage the second fastener 320 with the insertion hole 3192*a* of the second end 3192 of the latch 319. Therefore, the installation of the expansion module 30 to the housing 10 is finished.

In this embodiment, the expansion card assembly 313 is not limited to be positioned in the casing 311 via the positioning component 322. In some other embodiments, the positioning component may be omitted, and the expansion card assembly may be positioned in the casing via other suitable structures or components.

In addition, the expansion module 30 is not limited to being fixed in the housing 10 via the latch 319. In some other embodiments, the latch and the second fastener cooperated with the second fastener may be omitted, and the expansion module may be fixed in the housing via other components or structures according to actual requirements.

Furthermore, the base portion 3112 of the casing 311 is not limited to being removably mounted on the cover portion 3111. In some other embodiments, the base portion of the casing may be inseparably connected to the cover portion. In such case, the first fastener, the positioning hole of the cover portion, the mount components and the guide slots of the base portion may be omitted.

In this embodiment, the expansion card assembly 313 is not limited to being the double-width expansion card assembly 313. In some other embodiments, the expansion card assembly may be a single-width expansion card assembly, and the size of the casing may be modified correspondingly. In such a case, the front opening of the housing may be provided with more expansion modules. On the other hand, the quantity of the expansion card assembly 313 in the casing 311 of the expansion module 30 is not limited to being one. In some other embodiments, the casing may be enlarged in size to accommodate more than two single-width or double-width expansion card assemblies. In other words, the size and the quantity of the expansion card assembly in the expansion module may be flexibly modified according to actual requirements for achieving a variety of arrangements of the expansion modules at the front opening of the housing.

In this embodiment, the expansion module 30 not only is cooled via air cooling manner, but also is provided with the fluid connectors 33, and thus can be served as a part of the liquid cooling circulation for being cooled by the liquid cooling manner.

Note that the arrangements of the electronic components in the main body 31 of the expansion module 30 described above is merely exemplary and may be modified according to actual requirements. For example, the electronic components included in the main body of the expansion module may be not the expansion card assembly and the riser card but a hard disk drive instead.

According to the server and the expansion module as discussed in the above embodiments, the expansion module is removably disposed in the accommodation space of the housing and exposed to outside from the front opening, and the main body of the expansion module is provided with the fluid connectors and the main connector removable from the mainboard connector of the motherboard. Therefore, when the user desires to remove the expansion module from the housing for maintenance, the user can directly draw the expansion module out of the housing through the front opening without turning off the power of the server, drawing the server out of a server rack, removing an upper cover of the housing and detaching various pipelines or cables, thereby enhancing the efficiency of the maintenance of the expansion module.

Moreover, the size and the quantity of the expansion card assembly in the expansion module may be flexibly modified according to actual requirements for achieving a variety of arrangements of the expansion modules at the front opening of the housing.

Furthermore, the expansion module is not only cooled via air cooling manner, but also provided with the fluid connectors, thus the expansion module can be served as a part of the liquid cooling circulation for being cooled by the liquid cooling manner.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A server, comprising:

a housing, having an accommodation space, a front opening and a support surface, wherein the front opening is located at one side of the accommodation space and communicates with the accommodation space, and the support surface is located a bottom of the accommodation space;

a motherboard, located in the accommodation space and having at least one mainboard connector; and at least one expansion module, removably disposed in the accommodation space and exposed to outside from the front opening, wherein the at least one expansion module is removable from the accommodation space through the front opening along a direction perpendicular to a normal line of the support surface, the at least one expansion module comprises:

a main body;

a main connector, disposed on the main body and removably assembled with the at least one mainboard connector of the motherboard; and two fluid connectors, disposed on the main body.

2. The server according to claim 1, further comprising a power distribution board, wherein the power distribution board is located in the accommodation space, the power distribution board has an electrical connection portion, the at least one expansion module further comprises a power connector, and the power connector is disposed on the main body and is removably assembled with the electrical connection portion of the power distribution board.

3. The server according to claim 2, wherein the power connector is located between the main connector and the two fluid connectors.

4. The server according to claim 3, wherein the main body of the at least one expansion module is supported on the support surface, and the two fluid connectors are located closer to the support surface than the power connector and the main connector.

5. The server according to claim 2, wherein the main connector is located closer to the front opening than the power connector and the two fluid connectors.

6. The server according to claim 1, wherein the main body comprises a casing, a riser card and an expansion card assembly, the riser card and the expansion card assembly are disposed in the casing, the expansion card assembly comprises a circuit board and a heat dissipation device, the circuit board of the expansion card assembly is inserted into the riser card, the heat dissipation device is thermally coupled to the circuit board, the main connector is disposed on the casing and is electrically connected to the riser card, and the two fluid connectors are disposed on the casing and are connected to the heat dissipation device.

7. The server according to claim 6, wherein the casing comprises a cover portion and a base portion, the base portion is removably mounted on the cover portion, the cover portion and the base portion together form an inner space, the expansion card assembly and the riser card are located in the inner space, and the expansion card assembly has a bracket structure, the main body further comprises a positioning component, the positioning component is pivotably disposed on the cover portion and is abutted against the base portion, the positioning component has a positioning groove, and the bracket structure of the expansion card assembly is partially located in the positioning groove of the positioning component.

8. The server according to claim 1, wherein the main body comprises a casing, a riser card and an expansion card assembly, the casing comprises a cover portion and a base portion, the base portion is removably mounted on the cover portion, and the cover portion and the base portion together form an inner space, and the expansion card assembly and the riser card are located in the inner space.

9. The server according to claim 8, wherein the main body further comprises a first fastener, and the first fastener is movably disposed on the base portion and is selectively engaged with the cover portion.

10. The server according to claim 8, wherein the main body further comprises a latch and a second fastener, the latch has a first end and a second end located opposite to each other, the first end of the latch is pivotably disposed on the cover portion of the casing and is selectively engaged with the housing, and the second fastener is movably disposed on the base portion of the casing and is selectively engaged with the second end of the latch.

11. The server according to claim 10, wherein the main body further comprises an elastic component, two opposite ends of the elastic component are respectively connected to the cover portion of the casing and the latch, and the elastic component is configured to force the second end of the latch to move away from the second fastener.

12. The server according to claim 8, wherein the main body further comprises a mount component, the mount component comprises a wide portion and a narrow portion, a width of the wide portion is greater than a width of the narrow portion, the wide portion is connected to the cover portion via the narrow portion, the base portion has a guide slot, the guide slot has a release portion and an engagement portion connected to each other, the width of the wide portion of the mount component is greater than a width of the engagement portion, the narrow portion of the mount component is located in the engagement portion, and the base portion is partially located between the wide portion of the mount component and the cover portion.

13. The server according to claim 1, wherein the housing has at least one guide channel, the main body further comprises a casing and a plurality of guide blocks, the plurality of guide blocks are fixed to the casing and are arranged along a straight line, and the plurality of guide blocks are mounted in the at least one guide channel.

14. An expansion module, configured to be removable from an accommodation space of a housing through a front opening of the housing along a direction perpendicular to a normal line of a support surface of the housing located at a bottom of the accommodation space, comprising:

a main body;

a main connector, disposed on the main body and configured to be removably assembled with a mainboard connector of a motherboard; and two fluid connectors, disposed on the main body.

15. The expansion module according to claim 14, further comprising a power connector, wherein the power connector is disposed on the main body, and the power connector is located between the main connector and the two fluid connectors.

16. The expansion module according to claim 14, wherein the main body comprises a casing, a riser card and an expansion card assembly, the riser card and the expansion card assembly are disposed in the casing, the expansion card assembly comprises a circuit board and a heat dissipation device, the circuit board of the expansion card assembly is inserted into the riser card, the heat dissipation device is thermally coupled to the circuit board, the main connector is disposed on the casing and is electrically connected to the riser card, and the two fluid connectors are disposed on the casing and are connected to the heat dissipation device.

17. The expansion module according to claim 16, wherein the casing comprises a cover portion and a base portion, the base portion is removably mounted on the cover portion, the cover portion and the base portion together form an inner space, the expansion card assembly and the riser card are located in the inner space, and the expansion card assembly has a bracket structure, the main body further comprises a positioning component, the positioning component is pivotably disposed on the cover portion and is abutted against the base portion, the positioning component has a positioning groove, and the bracket structure of the expansion card assembly is partially located in the positioning groove of the positioning component.

18. The expansion module according to claim 14, wherein the main body comprises a casing, a riser card and an expansion card assembly, the casing comprises a cover portion and a base portion, the base portion is removably mounted on the cover portion, and the cover portion and the base portion together form an inner space, and the expansion card assembly and the riser card are located in the inner space.

19. The expansion module according to claim 18, wherein the main body further comprises a first fastener, and the first fastener is movably disposed on the base portion and is selectively engaged with the cover portion.

20. The expansion module according to claim 18, wherein the main body further comprises a latch and a second fastener, the latch has a first end and a second end located opposite to each other, the first end of the latch is pivotably disposed on the cover portion of the casing, the second fastener is movably disposed on the base portion of the casing and is selectively engaged with the second end of the latch.

* * * * *